United States Patent [19]

Keum et al.

[11] Patent Number: 5,796,649

[45] Date of Patent: Aug. 18, 1998

[54] DYNAMIC RANDOM ACCESS MEMORY CAPACITOR AND METHOD FOR FABRICATING THE SAME

[75] Inventors: Dong Yeal Keum; Cheol Soo Park; Eui Kyu Ryou, all of Kyoungki-do, Rep. of Korea

[73] Assignee: Hyundai Electronics Industries Co., Ltd., Kyoungki-do, Rep. of Korea

[21] Appl. No.: 658,807

[22] Filed: Jun. 7, 1996

Related U.S. Application Data

[62] Division of Ser. No. 297,759, Aug. 30, 1994, Pat. No. 5,543,346.

[51] Int. Cl.[6] .................... G11C 13/00; G11C 11/24
[52] U.S. Cl. .................................. 365/149; 365/51
[58] Field of Search ........................ 365/51, 52, 149, 365/189.01

[56] References Cited

U.S. PATENT DOCUMENTS

| | | | |
|---|---|---|---|
| 5,126,280 | 6/1992 | Chau et al. | 437/51 |
| 5,137,842 | 8/1992 | Chau et al. | 437/52 |
| 5,403,766 | 4/1995 | Miyhe | 437/52 |
| 5,432,110 | 7/1995 | Keum et al. | 437/60 |
| 5,468,670 | 11/1995 | Ryou | 437/52 |
| 5,623,442 | 4/1997 | Gotou et al. | 365/149 |

*Primary Examiner*—Terrell W. Fears
*Attorney, Agent, or Firm*—Gary M. Nath; Nath & Associates

[57] ABSTRACT

A DRAM capacitor and a method for fabricating the same, capable of achieving an increase in surface area and thereby an increase in capacitance while reducing the topology, by simply forming a conduction layer, as a charge storage electrode, comprised of conduction spacers around a double-layer pin-shaped conduction layer pattern or a combination of a central conduction layer pattern and an outer conduction layer pattern having an upwardly-opened dome structure surrounding the central conduction layer pattern, using an etch rate difference between insulating films.

6 Claims, 7 Drawing Sheets

FIG. 3E
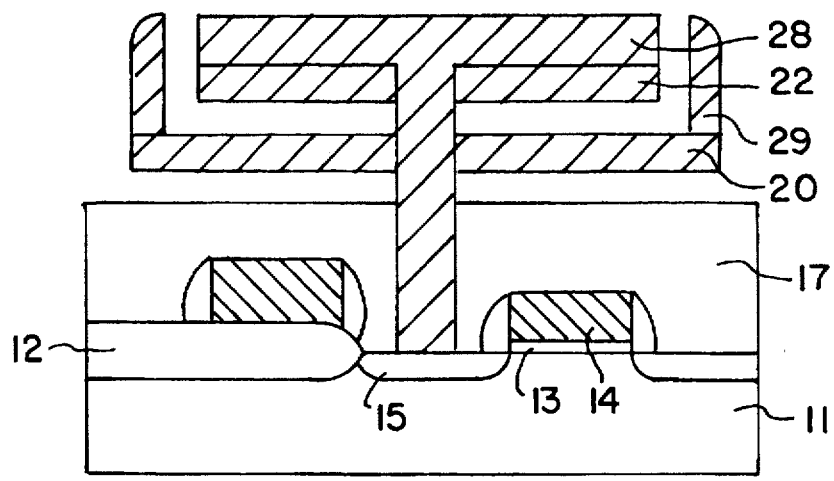
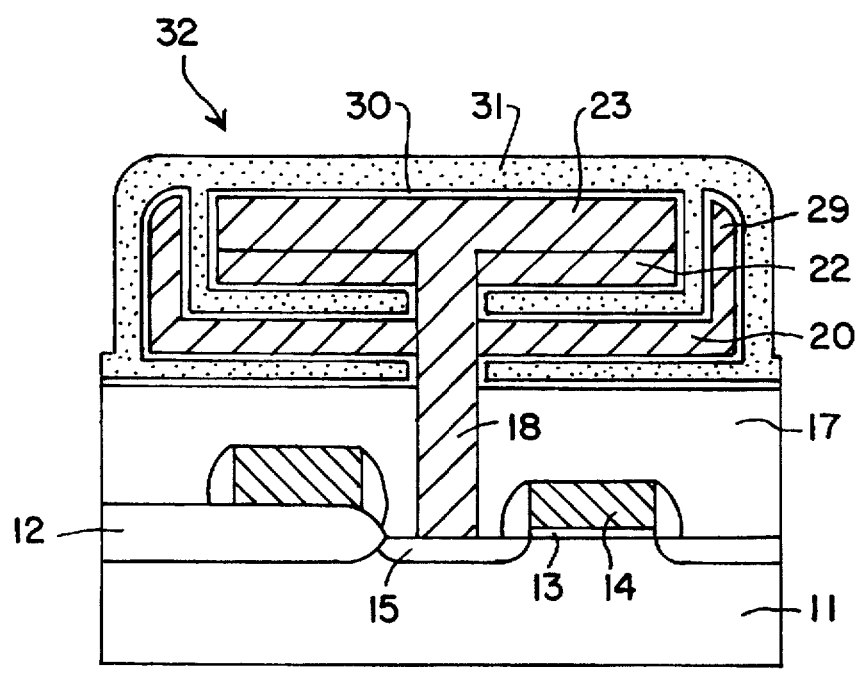
FIG. 3F

FIG. 4E
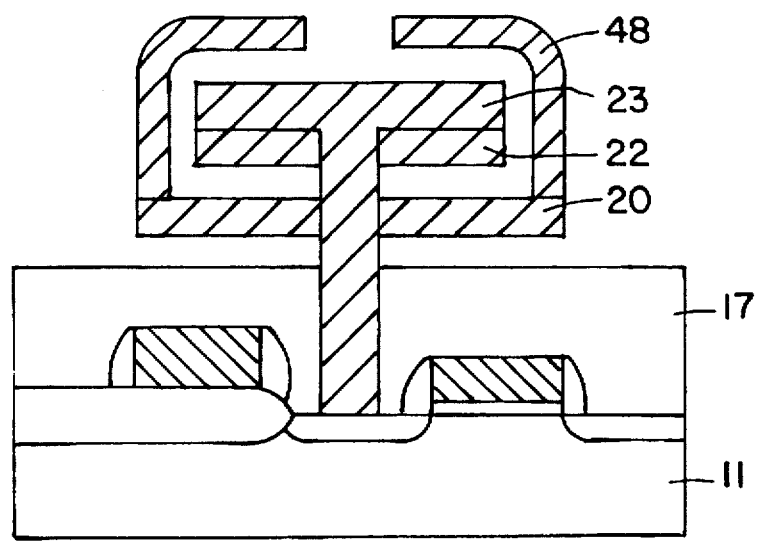
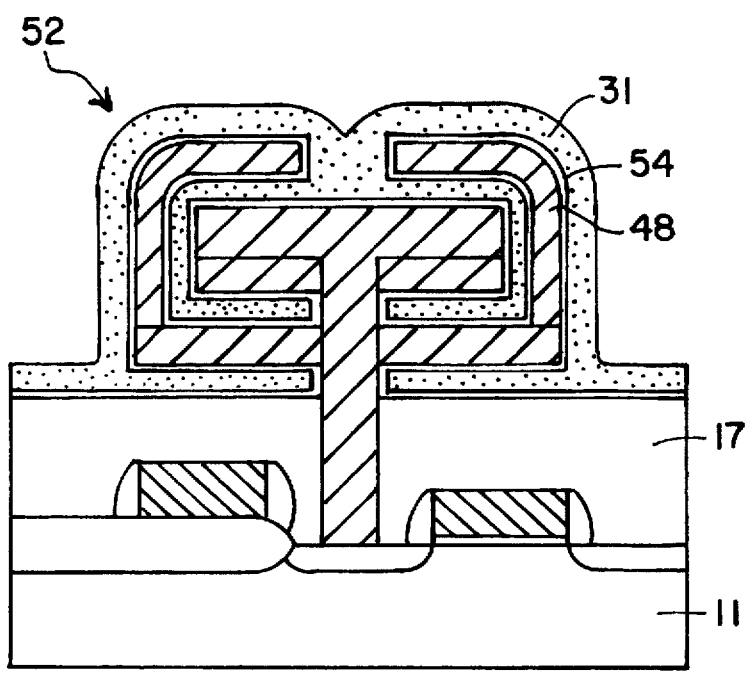
FIG. 4F 5,796,649

1

DYNAMIC RANDOM ACCESS MEMORY CAPACITOR AND METHOD FOR FABRICATING THE SAME

This application is a Divisional Application of U.S. patent application Ser. No. 08/297,759, filed Aug. 30, 1994, now U.S. Pat. No. 5,543,346, the entire contents of which are incorporated by reference.

BACKGROUND OF THE INVENTION

1. Field of the Invention

The present invention relates to a dynamic random access memory (DRAM) capacitor and a method for fabricating the same, and more particularly to a DRAM capacitor having a combination of the pin-shaped structure and the cylindrical structure and thereby capable of increasing its capacitance and yet reducing its topology, and a method for fabricating the DRAM capacitor.

2. Description of the Prior Art

Recent high integration trend of DRAM involves inevitably a reduction in cell dimension. However, such a reduction in cell dimension results in a difficulty to form capacitors having a sufficient capacitance. This is because the capacitance is determined by the surface area of capacitor. In a case of a DRAM device constituted by one MOS transistor and one capacitor, in particular, it is important to reduce the cell dimension and yet obtain a high capacitance of the capacitor, for the high integration of the DRAM device.

Capacitance of such a capacitor formed on a reduced area can be expressed by the following equation:

Capacitance (C) ∝Dielectric Constant X Surface Area÷Thickness of Dielectric Layer For increasing the capacitance, there have been various researches. For example, there have been known use of a dielectric material exhibiting a high dielectric constant, formation of a thin dielectric layer, formation of a capacitor having an increased surface area. Although various materials have been proposed as the dielectric material exhibiting a high dielectric constant, they have not been confirmed in reliance and thin film characteristic such as junction breakdown voltage. The reduction in thickness of dielectric layer results in damage of the dielectric layer severely affecting the reliance of capacitor. For increasing the surface area of capacitor, a complex process should be used. Furthermore, the increase in surface area results in a degradation in integration degree.

Generally, existing capacitors includes a conduction layer comprised of a polysilicon layer and a dielectric layer comprised of an oxide film, a nitride film or a combination thereof. For an increase in surface area of capacitor, the polysilicon layer has a multi-layer structure and spacers having a pin shape, a cylindrical shape or a rectangular frame shape extending through the multilayer structure to connect layers of the multi-layer structure.

Now, a description will be made in conjunction with the pinshaped capacitor. For fabricating the pin-shaped capacitor, first, an interlayer insulating film and a first planarizing layer are sequentially formed over a semiconductor substrate having a field oxide film at its element isolation region and elements such as a gate oxide film and a gate at its active region, thereby planarizing the semiconductor substrate. Thereafter, a first conduction layer, a first insulating film, a second conduction layer and a second insulating film are sequentially formed over the first planarizing layer.

2

Subsequently, all the layers formed over the semiconductor substrate are sequentially removed at their portions disposed over a portion of the semiconductor substrate defined as the active region to be in contact with a capacitor, thereby forming a contact hole. A third conduction layer is coated over the resulting structure so as to fill the contact hole. over the third conduction layer, a third insulating film is formed. Thus, a pin-shaped capacitor is obtained which has a structure of vertically connecting the conduction layers with one another.

Although the conventional pin-shaped capacitor has an increased surface area because it is of the multi-layer structure, it still has an insufficient capacitance due to the high integration of a DRAM device employing it. As a result, the DRAM device encounters a degradation in reliance of its operation. Since the capacitor had the multi-layer structure, an increase in topology occurs, thereby causing subsequent layers to be degraded in capability of coating steps.

On the other hand, in fabrication of the cylindrical capacitor, a conduction layer is coated over a planarizing layer of a semiconductor substrate structure obtained after formation of a contact hole through which an active region of the semiconductor substrate to be in contact with a capacitor, so as to fill the contact hole. An insulating film pattern having a cylindrical bar shape is then formed on a portion of the conduction layer disposed over the contact hole. Side walls having the shape of spacer is formed around the cylindrical bar by using a conduction material, so as to isolate the cylindrical bar. Thus, a cylindrical capacitor is obtained.

Although the cylindrical capacitor has an advantage of a reduced topology, as compared with the pin-shaped capacitor, it encounters a degradation in integration degree because it should occupy a large area for obtaining a sufficient capacitance, due to its small surface area. Of course, the capacitance may be increased by repeatedly forming cylindrical side walls to be shaped into a plurality of concentric circles. In this case, however, the overall fabrication becomes complex.

SUMMARY OF THE INVENTION

Therefore, an object of the invention is to solve the above-mentioned problems encountered in the prior art and, thus, to provide a DRAM capacitor having a combination of the pin-shaped structure and the cylindrical structure and thereby capable of increasing its capacitance and yet reducing its topology, and a method for fabricating the DRAM capacitor.

In accordance with one aspect, the present invention provides a dynamic random access memory capacitor comprising: a planarizing layer formed over a semiconductor substrate including a field oxide film, a gate oxide film, gates, and bit lines; a contact hole formed by removing a predetermined portion of the planarizing layer disposed over a predetermined active region of the semiconductor substrate to be in contact with the capacitor is exposed, the active region being exposed through the contact hole; a first conduction layer pattern upwardly spaced a predetermined distance apart from the planarizing layer; a second conduction layer pattern upwardly spaced a predetermined distance apart from the first conduction layer, the second conduction layer pattern extending through the first conduction layer pattern to fill the contact hole and having a smaller width than the first conduction layer pattern such that an edge of the first conduction layer pattern is exposed; a conduction spacer formed on the edge of the first conduction layer pattern and spaced apart from an end of the second conduction layer pattern; and an insulating film formed over exposed surfaces of the first and second conduction layer patterns and an exposed surface of the planarizing layer.

In accordance with another aspect, the present invention provides a method for fabricating dynamic random access memory capacitor, comprising the steps of: forming a planarizing layer formed over a semiconductor substrate including a field oxide film, a gate oxide film, gates, and bit lines; forming a first insulating film over the planarizing layer; forming a first conduction layer over the first insulating layer; forming a second insulating film over the first conduction layer; sequentially removing predetermined portions of the layers from the second insulating layer to the planarizing layer such that a region of the semiconductor substrate to be in contact with the capacitor is exposed, thereby forming a contact hole through which the semiconductor substrate is partially exposed; forming a second conduction layer formed over the entire exposed upper surface of the resulting structure to cover an upper surface of second insulating film and fill the contact hole; forming a third insulating film over the second conduction layer; sequentially removing the layers from the third insulating film to the second insulating film except for their portions to constitute a part of the capacitor, thereby forming patterns of the third insulating film, second conduction layer and second insulating film by which the first conduction layer is partially exposed; forming an insulating spacer on side walls of the third insulating film pattern, second conduction layer pattern and second insulating film pattern; forming a conduction spacer on an outer wall surface of the insulating spacer; and removing the exposed portion of the first conduction layer using the third insulating film pattern as a mask, thereby isolating the capacitor.

In accordance with another aspect, the present invention provides a method for fabricating dynamic random access memory capacitor, comprising the steps of: forming a planarizing layer formed over a semiconductor substrate including a field oxide film, a gate oxide film, gates, and bit lines; forming a first insulating film over the planarizing layer; forming a first conduction layer over the first insulating layer; forming a second insulating film over the first conduction layer; sequentially removing predetermined portions of the layers from the second insulating layer to the planarizing layer such that a region of the semiconductor substrate to be in contact with the capacitor is exposed, thereby forming a contact hole; forming a second conduction layer formed over the entire exposed upper surface of the resulting structure to cover an upper surface of second insulating film and fill the contact hole; forming a third insulating film over the second conduction layer; forming a fourth insulating film over the third insulating film, the fourth insulating film being made of a different material from that of the third insulating film; forming a fifth insulating film over the fourth insulating film, the fifth insulating film being made of a different material from that of the fourth insulating film; sequentially removing the layers from the fifth insulating film to the second insulating film except for their portions to constitute a part of the capacitor, thereby forming patterns of the fifth insulating film, fourth insulating film, third insulating film, second conduction layer and second insulating film; forming a sixth insulating film over the fifth insulating film, the sixth insulating film being made of a different material from that of the fifth insulating film; etching the sixth insulating film at its entire upper surface, thereby forming an insulating spacer on side walls of the second insulating film pattern, second conduction layer pattern and third insulating film pattern; partially removing the fourth insulating film pattern except for its portion disposed above the contact hole, thereby forming a gap between the third and fifth insulating film; coating a conduction material over the entire exposed surface of the resulting structure, thereby forming a third conduction layer covering an upper surface of the first conduction layer and filling the gap; etching the third conduction layer at its entire upper surface such that the third conduction layer remains at its portion disposed in the gap and on the insulating spacer; and removing an exposed portion of the first conduction layer using the fifth insulating film pattern as a mask, thereby isolating the capacitor.

BRIEF DESCRIPTION OF THE DRAWINGS

The above and other objects, features and advantages of the present invention will be more clearly understood from the following detailed description taken in conjunction with the accompanying drawings, in which:

FIG. 3A to 3F are sectional views respectively illustrating a method for fabricating a DRAM capacitor in accordance with an embodiment of the present invention; and FIGS. 4A to 4F are sectional views respectively illustrating a DRAM capacitor in accordance with another embodiment of the present invention.

DETAILED DESCRIPTION OF THE PREFERRED EMBODIMENTS

Figure 1:
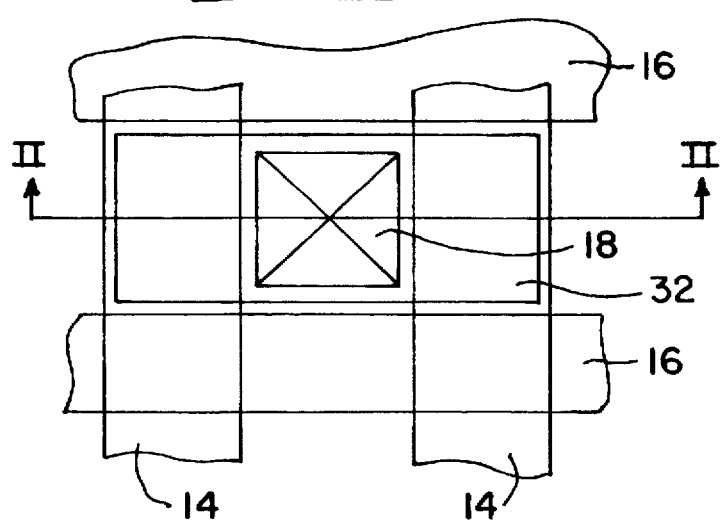
FIG. 1 is a plan view illustrating a layout of a DRAM device formed with a capacitor in accordance with the present invention.

FIG. 1 is a plan view illustrating a layout of a DRAM device formed with a capacitor in accordance with the present invention.

As shown in FIG. 1, the DRAM device includes a plurality of gates 14 formed as word lines on a semiconductor substrate and arranged to extend in parallel to one another in a horizontal direction. The DRAM device also includes a plurality of bit lines 16 formed on the semiconductor substrate and arranged to extend in parallel to one another in a vertical direction. Between neighboring bit lines 16, a capacitor 32 having a rectangular shape extends in parallel to the bit lines 16 such that it is in contact with neighboring gates 14. A capacitor contact hole 18 is provided at the semiconductor substrate which has a matrix structure obtained by the gates 14 and bit lines 16.

Figure 2:
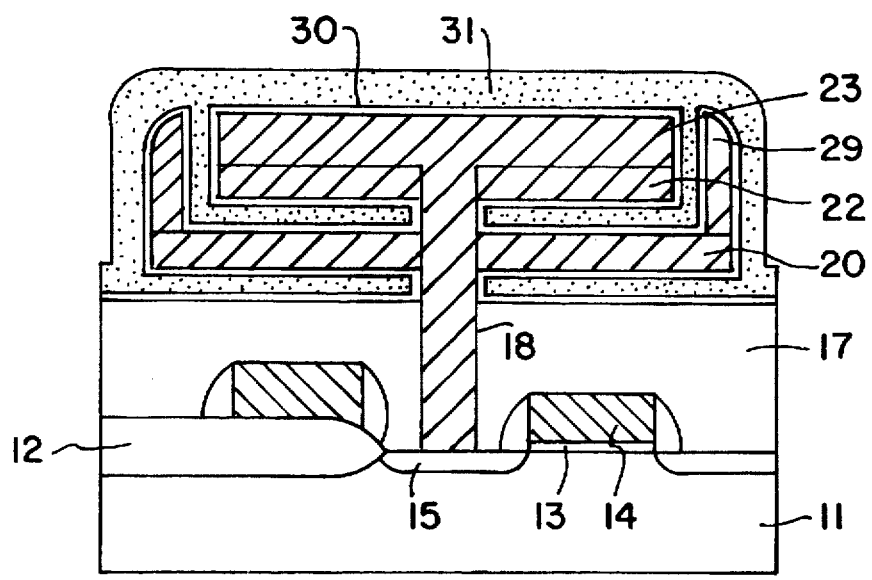
FIG. 2 is a sectional view taken along the line II—II of FIG. 1.

A vertical structure of the DRAM device will now be described, in conjunction with FIG. 2. The semiconductor substrate 11 has a general metal oxide semiconductor field effect transistor (MOSFET) structure including a field oxide film 12, a gate oxide film 13, gates 14 and etc. Over the semiconductor substrate 11, a planarizing layer 17 is coated which may be made of boro phospho silicate glass (BPSG), phospho silicate glass (PSG), or undoped silicate glass (USG). The planarizing layer 17 is partially removed at its predetermined portion to form the contact hole 18 through which an active region 15 of the semiconductor substrate 11 to be in contact with a capacitor is exposed. Above the planarizing layer 17, a first patterned conduction layer 20 is formed such that it is spaced a predetermined distance apart from the planarizing layer 17. The first conduction layer 20 is made of polysilicon.

Above the first conduction layer 20, a second patterned conduction layer 22 is formed such that it is spaced a predetermined distance apart from the first conduction layer 20. The second conduction layer 22 is made of polysilicon. Over the second conduction layer 22, a third patterned conduction layer 23 is formed. The third conduction layer 23 extends vertically through the second conduction layer 22 and the first conduction layer 20 to fill the contact hole 18 and come into contact with the active region 15. The second and third conduction layers 22 and 23 have a smaller width than the first conduction layer 20 such that the first conduction layer 20 is exposed at its edge portion. The first, second and third conduction layers 20, 22 and 23 form a pin-shaped structure. On the edge of the first conduction layer 20, a conduction spacer 29 comprised of a fourth conduction layer (not shown) is formed which extends vertically to form a frame structure. An insulating film 30 as a fifth layer is formed over the exposed portions of the first, second and third conduction layers 20, 22 and 23, conduction spacer 29 and planarizing layer 17. The insulating film 30 is of an oxide-nitride-oxide (ONO) structure. A conduction material is formed over the resulting structure such that it fills all gaps defined in the structure, thereby forming a plate electrode 31.

Such a DRAM capacitor structure has both the large area characteristic of the pin-shaped structure and the low topology characteristic of the cylindrical structure.

Now, a method for fabricating such a DRAM capacitor structure in accordance with an embodiment of the present invention will be described, in conjunction with FIGS. 3A to 3F. In FIGS. 3A to 3F, elements respectively corresponding to those in FIG. 2 are denoted by the same reference numerals.

Figure 3A:
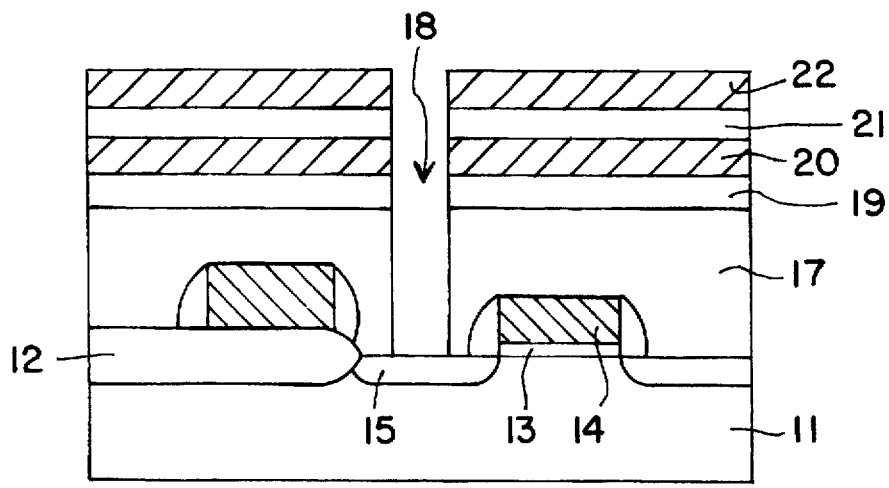

In accordance with the method, first, a planarizing layer 17 is formed over a semiconductor substrate 11 having a MOSFET structure including a field oxide film 12, sources or drains (not shown), a gate oxide film 13, gates 14 and etc., as shown in FIG. 3A. Over the planarizing layer 17, a first insulating film 19 as a cap insulating layer, a first conduction layer 20, a second insulating film 21 as a buffer insulating layer and a second conduction layer 22 as an etch mask are sequentially formed. The first and second conduction layers 20 and 22 are made of, for example, polysilicon and formed using a chemical vapor deposition (CVD) process.

Thereafter, all the layers formed over the semiconductor substrate 11 are sequentially removed at their predetermined portions so as to expose an active region 15 of the semiconductor substrate 11 defined between neighboring gates 14, thereby forming a contact hole 18.

Formation of the contact hole 18 will now be described in detail.

Since the contact hole 18 has a small dimension due to the high integration of the semiconductor device, the layers on the semiconductor substrate 11 except for the planarizing layer 17 are primarily removed in a sequential manner using a photoresist pattern (not shown) as an etch mask, thereby forming a hole. Thereafter, a polysilicon spacer is formed on an inner wall of the hole. Using the spacer as a mask, the planarizing layer 17 is then partially removed at its predetermined portion to form the contact hole 18. At this time, the second conduction layer 22 also serves as the etch mask. The reason why the contact hole 18 is formed using so complex method is because in case of DRAM devices having a high integration degree of 64 Mega grade or greater, a sufficient fine pitch of, for example, 0.4 μm is hardly obtained by using only the photoresist pattern due to the limited pitch of existing photoresist patterns. If a desired fine pitch is obtained only by the photoresist pattern, the second conduction layer 22 is unnecessary.

Figure 3B:
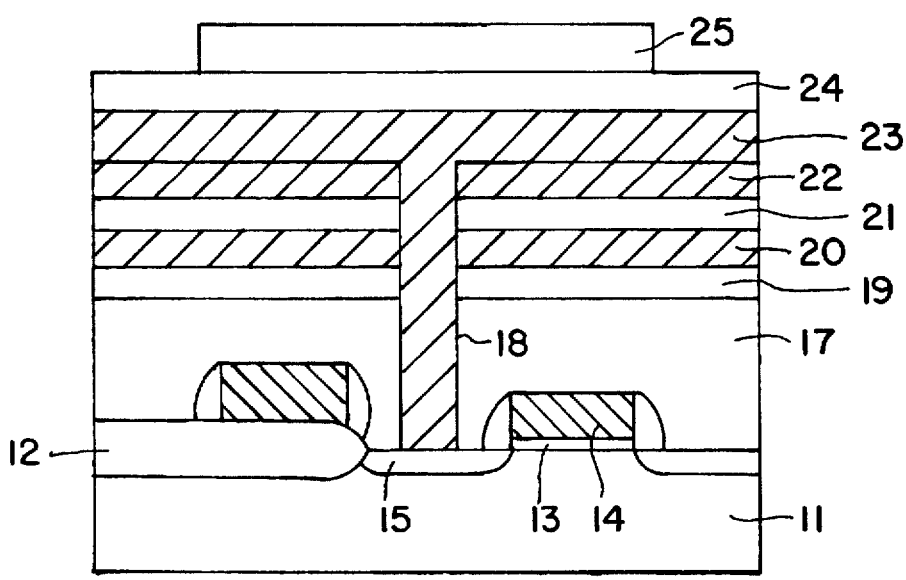

Over the entire exposed surface of the resulting structure, a conduction material such as polysilicon is coated, thereby forming a third conduction layer 23, as shown in FIG. 3B. The third conduction layer 23 covers the second conduction layer 22 and fills the contact hole 18. Over the third conduction layer 23, a third insulating film 24 is then formed. Thereafter, a photoresist pattern 25 is formed over the third insulating film 24 to protect a portion of the third insulating film 24 to be defined as a capacitor region.

Figure 3C:
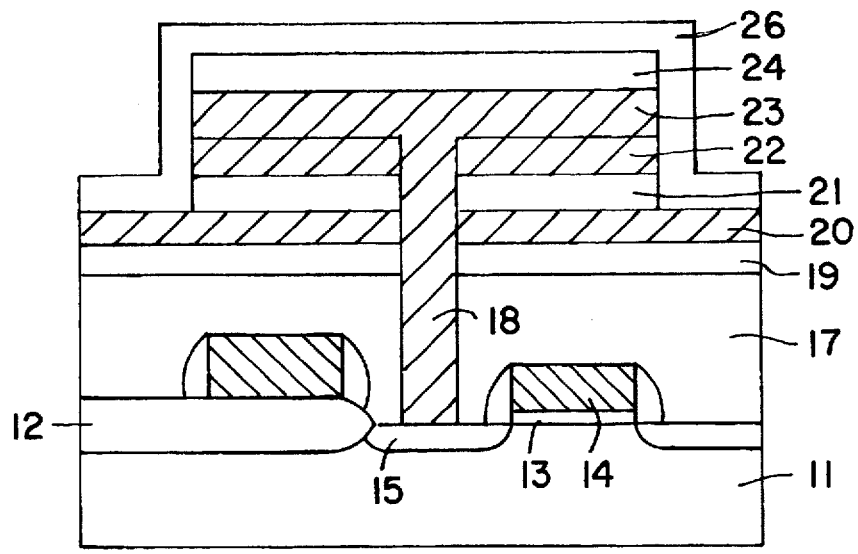

As shown in FIG. 3C, the layers from the third insulating film 24 to the second insulating film 21 formed on the semiconductor substrate 11 are then sequentially removed at their portions not covered with the photoresist pattern 25, thereby forming patterns of the third insulating film 24, third conduction layer 23, second conduction layer 22 and second insulating film 21. Thereafter, the photoresist pattern 25 is completely removed. Over the entire exposed surface of the resulting structure, a fourth insulating film 26 is formed.

Figure 3D:
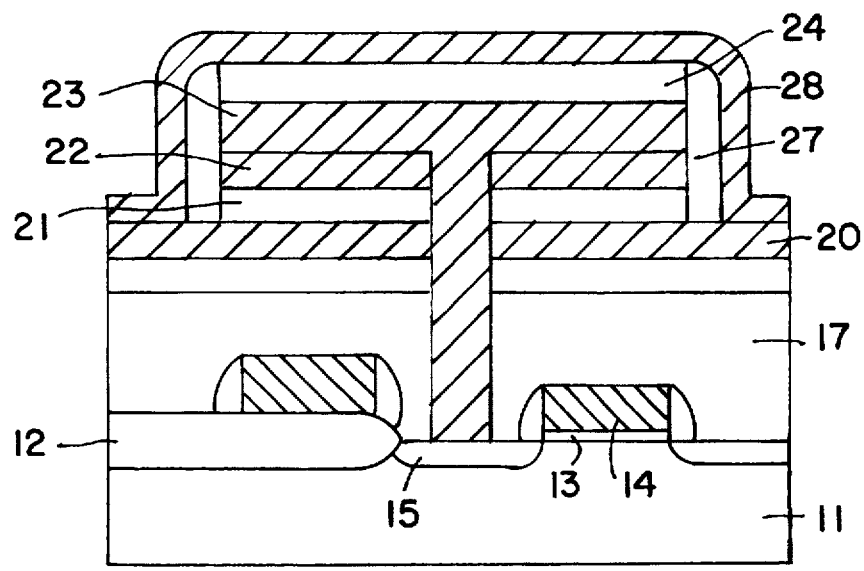

As shown in FIG. 3D, the fourth insulating film 26 is then anisotropically etched at its full upper surface, thereby forming insulating spacers 27 extending along side walls of the layers from the patterned third insulating film 24 to the patterned insulating film 21. At this time, the patterned third insulating film 24 and the first conduction layer 20 are exposed. Subsequently, a fourth conduction layer 28 made of polysilicon is formed over the entire exposed surface of the resulting structure.

As shown in FIG. 3E, the fourth conduction layer 28 is then anisotropically etched at its full upper surface, thereby forming conduction spacers 27 in outside of the insulating spacers 27. Then, the etching is continued to remove the exposed first conduction layer 20, thereby isolating capacitor structures. Then, the patterned fourth insulating film 26 is completely removed. Subsequently, the first insulating film 19, the insulating spacers 27 and the second insulating film 21 interposed between the first and second conduction layers 20 and 22 are completely removed.

In this case, the planarizing layer 17 is made of a combination of materials exhibiting a good etch selectivity, as compared to the first, second, third and fourth insulating films 19, 21, 24 and 26. Use of such materials is to take into consideration a convenience upon etching. For example, the planarizing layer 17 may be comprised of a combination of a nitride film and an oxide film formed using the CVD process or a combination of BPSG, PSG, USG and tetra-ethylorthosilicate (TEOS) formed using a spin coating process. Experimentally, the inventors could obtain the above-mentioned structure by using a combination of BPSG exhibiting a high etch selectivity to a buffer oxide etchant (BOE) with PSG or TEOS.

Over the entire exposed surface of the resulting structure, a fifth insulating film 30 comprised of an oxide film, a nitride film or an ONO film is then formed, as shown in FIG. 3F. Thereafter, a plate electrode 31 is formed over the entire exposed surface of the resulting structure, thereby obtaining a capacitor 32.

Since the capacitor is of a combination of the pin-shaped structure and a rectangular frame-shaped structure in accordance with the present invention, it is possible to increase the surface area of the capacitor and thereby the capacitance of the capacitor is while reducing the topology. Moreover, the overall fabrication is simple.

Where a multi-layer pin-shaped structure is formed by repeatedly forming conduction layers and insulating layers in an alternating manner over the second insulating film 21 prior to the formation of the second conduction layer 22 as the etch mask, it is possible to more increase the capacitance.

A capacitor structure having a more enlarged surface area may be formed by enlarging the conduction spacers having the rectangular frame-shaped structure. In this case, an upwardly opened dome structure is formed.

FIGS. 4A to 4F are sectional views respectively illustrating a DRAM capacitor in accordance with another embodiment of the present invention. In FIGS. 4A to 4F, elements respectively corresponding to those in FIGS. 3A to 3F are denoted by the same reference numerals.

Figure 4A:
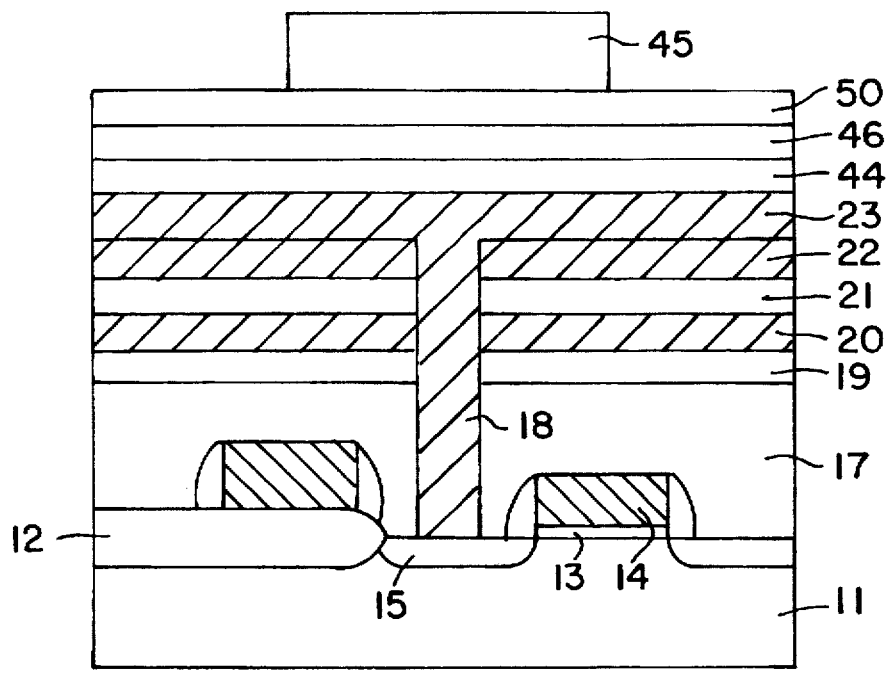

In accordance with the method, first, a planarizing layer 17, a first insulating film 19, a first conduction layer 20, a second insulating film 21 and a second conduction layer 22 are sequentially formed over a semiconductor substrate 11 having a MOSFET structure, as shown in FIG. 4A.

Thereafter, all the layers from the second conduction layer 22 to the planarizing layer 17 formed over the semiconductor substrate 11 are sequentially removed at their predetermined portions so as to expose an active region 15 of the semiconductor substrate 11, thereby forming a contact hole 18. Where a photoresist pattern having a sufficiently fine pitch can be used upon forming the contact hole 18, the second conduction layer 22 as a part of an etch mask used upon forming the contact hole 18 is unnecessary.

Over the entire exposed surface of the resulting structure, a third conduction layer 23 is formed such that it covers the second conduction layer 22 and fills the contact hole 18. Over the third conduction layer 23, a third insulating film 24, a fourth insulating film 46 and a fifth insulating film So are sequentially formed. In this case, the fourth insulating film 46 is made of a material exhibiting a superior wet and dry etch selectivity, as compared to the second and third insulating films 21 and 44. For example, the fourth insulating film 46 is made of a combination of PSG with TEOS or a high temperature oxide film. On the other hand, the fifth insulating film 50 is made of a material exhibiting a superior wet etch selectivity, as compared to other insulating films, for example, the fifth insulating film 50 is made of a nitride film.

Thereafter, a photoresist pattern 4S is formed over the fifth insulating film 50 to protect portions of the layers disposed over the contact hole 18 to be defined as a capacitor region.

Figure 4B:
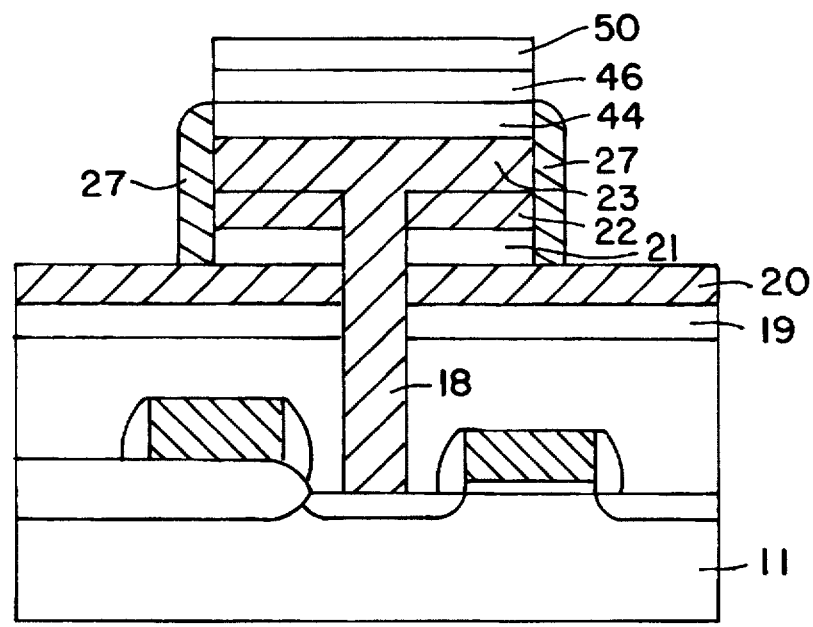

Using the photoresist pattern 45 as a mask, the layers from the fifth insulating film 50 to the second insulating film 21 are sequentially removed, there forming patterns of the fifth insulating film 50, fourth insulating film 46 and third insulating film 44, third conduction layer 23, second conduction layer 22 and second insulating film 21, as shown in FIG. 4B. Thereafter, the photoresist pattern 45 is completely removed. Over the entire exposed surface of the resulting structure, another insulating film (not shown) is formed. The insulating film is then anisotropically etched at its full upper surface until the patterned fourth insulating film 46 is exposed, thereby forming insulating spacers 27 extending along side walls of the layers from the patterned second insulating film 21 to the patterned third insulating film 44.

Figure 4C:
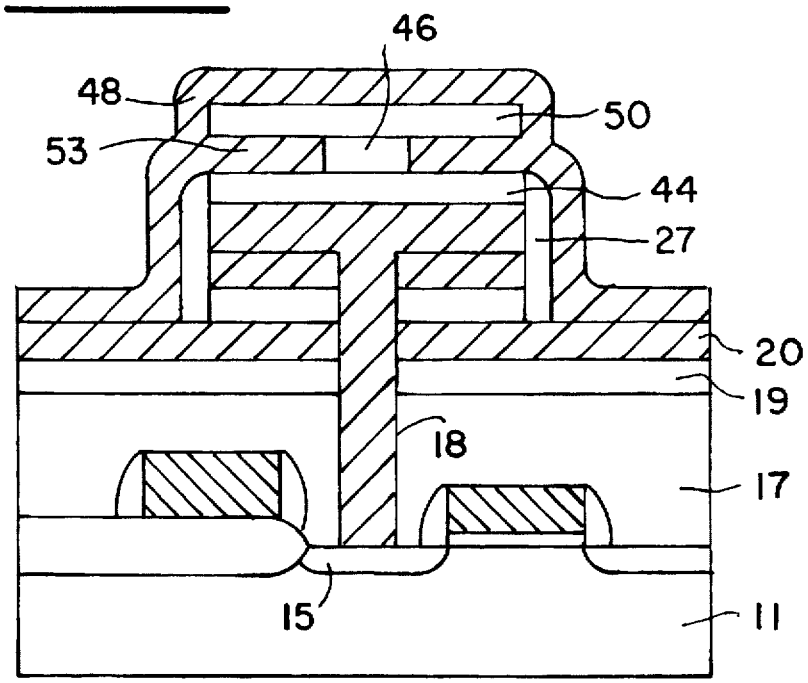

Thereafter, the resulting structure is wet or dry etched by utilizing the etch selectivity of the fourth insulating film 46 to the third and fifth insulating films 44 and 50, for example, an HF vapor etch process, thereby leaving the fourth insulating film 46 at its portion disposed above the contact hole 18, as shown in FIG. 4C. At this time, the third and fifth insulating films 44 and SO are hardly etched. As a result, a gap 53 is formed between the third and fifth insulating films 44 and SO. Over the entire exposed surface of the resulting structure, polysilicon then is coated using the CVD process to form a fourth conduction layer 48 covering the insulating spacers 27, the interior of the gap 53 and the fifth insulating film 50.

Figure 4D:
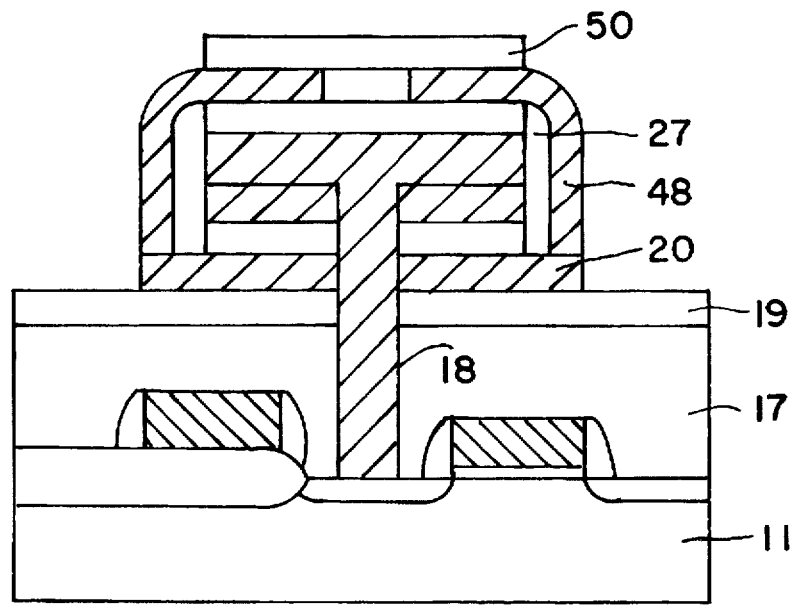

Using the patterned fifth insulating film 50 as a mask, the fourth conduction layer 48 is etched at its entire upper surface such that it remains at its portions disposed in the gap 53 and on the insulating spacers 27, as shown in FIG. 4D. The etching is continued to remove an exposed portion of the first conduction layer 20, thereby isolating capacitor structures from one another.

As shown in FIG. 4Eh the patterned fifth and fourth insulating films 50 and 46, the insulating spacers 27, the patterned second insulating film 21 and the first insulating film 19 are then removed. In this case, materials of the first insulating film t9 and planarizing layer 17 are selected to exhibit a high difference in etch rate therebetween so that the planarizing layer 17 is hardly removed upon the etching.

Over the entire exposed surface of the resulting structure, a sixth insulating film 54 is coated, as shown in FIG. 4F. Thereafter, a plate electrode 51 is formed over the entire exposed surface of the resulting structure, thereby obtaining a capacitor 52.

As apparent from the above description, the present invention provides a DRAM capacitor and a method for fabricating the same, capable of achieving an increase in sur face are a and thereby a n increase in capacitance while reducing the topology, by simply forming a conduction layer, as a charge storage electrode, comprised of conduction spacers around a double-layer pin-shaped conduction layer pattern or a combination of a central conduction layer pattern and an outer conduction layer pattern having an upwardly-opened dome structure surrounding the central conduction layer pattern, using an etch rate difference between insulating films.

Although the preferred embodiments of the present invention have been disclosed for illustrative purpose, those skilled in the art will appreciate that various modifications, additions and substitutions are possible, without departing from the scope and spirit of the invention as disclosed in the accompanying claims,

What is claimed is:

1. A dynamic random access memory capacitor comprising:

a planarizing layer formed over a semiconductor substrate including a field oxide film, a gate oxide film, gates and bit lines;

a contact hole formed by removing a predetermined portion of the planarizing layer disposed over a predetermined active region of the semiconductor substrate to be in contact with the capacitor is exposed, the active region being exposed through the contact hole;

a first conduction layer upwardly spaced a predetermined distance apart from the planarizing layer;

a second conduction layer upwardly spaced a predetermined distance apart from the first conduction layer, the second conduction layer extending through the first conduction layer to fill the contact hole and having a smaller width than the first conduction layer such that an edge of the first conduction layer is exposed;

a conduction spacer formed on the edge of the first conduction layer and spaced apart from an end of the second conduction layer; and an insulating film formed over exposed surfaces of the first and second conduction layers and an exposed surface of the planarizing layer.

2. A dynamic random access memory capacitor in accordance with claim 1, wherein the first and second conduction layer is made of a polysilicon.

3. A dynamic random access memory capacitor in accordance with claim 1, wherein the conduction spacer is substituted by a conduction layer having an upwardly-opened dome structure covering up to an upper surface of the second conduction layer.

4. A dynamic random access memory capacitor in accordance with claim 1, further comprising an additional conduction layer spaced a predetermined distance apart from the second conduction layer.

5. A dynamic random access memory capacitor in accordance with claim 2, wherein the conduction spacer is substituted by a conduction layer having an upwardly opened dome structure covering up to an upper surface of the second conduction layer.

6. A dynamic random access memory capacitor in accordance with claim 2, further comprising an additional conduction layer spaced a predetermined distance apart from the second conduction layer.

* * * * *